(12) United States Patent
Yan et al.

(10) Patent No.: US 9,252,165 B2
(45) Date of Patent: Feb. 2, 2016

(54) SEMICONDUCTOR DEVICE STRUCTURE, METHOD FOR MANUFACTURING THE SAME AND PIXEL STRUCTURE USING THE SAME

(71) Applicant: Industrial Technology Research Institute, Hsinchu (TW)

(72) Inventors: Jing-Yi Yan, Zhubei (TW); Chih-Chieh Hsu, Hsinchu (TW); Liang-Hsiang Chen, Taichung (TW); Chen-Wei Lin, Kaohsiung (TW)

(73) Assignee: Industrial Technology Research Institute, Hsinchu (TW)

( * ) Notice: Subject to any disclaimer, the term of this patent is extended or adjusted under 35 U.S.C. 154(b) by 0 days.

(21) Appl. No.: 14/184,148

(22) Filed: Feb. 19, 2014

(65) Prior Publication Data

US 2014/0231811 A1    Aug. 21, 2014

(30) Foreign Application Priority Data

Feb. 20, 2013    (TW) .............................. 102105868 A

(51) Int. Cl.
| | | |
|---|---|---|
| *H01L 29/786* | (2006.01) | |
| *H01L 27/12* | (2006.01) | |
| *H01L 29/49* | (2006.01) | |
| *H01L 27/32* | (2006.01) | |

(52) U.S. Cl.
CPC ........ *H01L 27/1248* (2013.01); *H01L 27/1218* (2013.01); *H01L 27/326* (2013.01); *H01L 27/3262* (2013.01); *H01L 29/4908* (2013.01); *H01L 29/78606* (2013.01); *H01L 29/78609* (2013.01)

(58) Field of Classification Search
CPC .............. H01L 27/1266; H01L 29/786; H01L 29/4908; H01L 29/66742; H01L 27/326; H01L 27/1218; H01L 27/1248; H01L 27/3262; H01L 29/78606; H01L 29/78609
See application file for complete search history.

(56) References Cited

U.S. PATENT DOCUMENTS

| | | |
|---|---|---|
| 7,943,932 B2 | 5/2011 | Park et al. |
| 2002/0100984 A1* | 8/2002 | Oshima et al. ................ 257/774 |

(Continued)

OTHER PUBLICATIONS

Fulvia Mameli, et al., "A completely flexible organic transistor obtained by a one-mask photolighographic process", Applied Physics Letters, vol. 82, No. 20, May 19, 2003, pp. 3550-3552.

(Continued)

*Primary Examiner* — Tan N Tran
*Assistant Examiner* — Fazli Erdem
(74) *Attorney, Agent, or Firm* — Muncy, Geissler, Olds & Lowe P.C.

(57) ABSTRACT

A semiconductor device structure is provided. The semiconductor device structure may include a substrate, a semiconductor layer, a first conductive layer, a second conductive layer, a first dielectric layer and a second dielectric layer. The first dielectric layer is disposed on the substrate. The second dielectric layer is disposed on the first dielectric layer. The semiconductor layer is adjacent to the first dielectric layer or the second dielectric layer. The semiconductor layer is disposed on the first dielectric layer or the second dielectric layer. The first conductive layer is adjacent to the first dielectric layer or the second dielectric layer. The second conductive layer is disposed on the first dielectric layer or the second dielectric layer. The effective Young's modulus of the second dielectric layer may be smaller than the Young's modulus of the first dielectric layer.

19 Claims, 8 Drawing Sheets

(56) References Cited

U.S. PATENT DOCUMENTS

| | | | |
|---|---|---|---|
| 2004/0043538 A1* | 3/2004 | Lo et al. .................... | 438/117 |
| 2004/0149987 A1 | 8/2004 | Kim et al. | |
| 2005/0162366 A1* | 7/2005 | Moriya et al. .............. | 345/97 |
| 2005/0260794 A1* | 11/2005 | Lo et al. .................... | 438/108 |
| 2006/0113617 A1* | 6/2006 | Kawamura et al. ......... | 257/414 |
| 2006/0202206 A1* | 9/2006 | Koyama et al. ............ | 257/67 |
| 2007/0077691 A1* | 4/2007 | Watanabe .................. | 438/149 |
| 2007/0132381 A1* | 6/2007 | Hayashi et al. ............ | 313/512 |
| 2007/0238218 A1* | 10/2007 | Teng et al. ................. | 438/99 |
| 2008/0105873 A1 | 5/2008 | Wang et al. | |
| 2008/0284331 A1* | 11/2008 | Hayashi ..................... | 313/512 |
| 2009/0256154 A1 | 10/2009 | Lee et al. | |
| 2010/0007942 A1* | 1/2010 | Oikawa et al. ............. | 359/296 |
| 2010/0013383 A1* | 1/2010 | Kim et al. .................. | 313/504 |
| 2010/0127270 A1* | 5/2010 | Yan et al. ................... | 257/66 |
| 2010/0238095 A1* | 9/2010 | Zhang ........................ | 345/82 |
| 2010/0270556 A1 | 10/2010 | Wang et al. | |
| 2011/0025585 A1* | 2/2011 | Kim et al. .................. | 345/76 |
| 2011/0147747 A1 | 6/2011 | Jeon et al. | |
| 2011/0227084 A1 | 9/2011 | Giesbers et al. | |
| 2011/0309498 A1* | 12/2011 | Yamano ..................... | 257/737 |
| 2012/0002127 A1* | 1/2012 | Yamazaki et al. .......... | 349/43 |
| 2012/0033151 A1* | 2/2012 | Toyotaka et al. ........... | 349/43 |
| 2013/0334590 A1* | 12/2013 | Watanabe et al. .......... | 257/324 |

OTHER PUBLICATIONS

Jaeyoung Jang, et al., "High $T_g$ cyclic olefin copolymer/$Al_2O_3$ bilayer gate dielectrics for flexible organic complementary circuits with low-voltage and air-stable operation", Journal of Materials Chemistry, vol. 21, 2011, pp. 12542-12546.

Shinhyuk Yang, et al., "Environmentally Stable Transparent Organic/Oxide Hybrid Transistor Based on an Oxide Semiconductor and a Polyimide Gate Insulator", IEEE Electron Device Letters, vol. 31, No. 5, May 2010, pp. 446-448.

Daniele Braga, et al., "High-Performance Organic Field-Effect Transistors", Advanced Materials, vol. 21, 2009, pp. 1473-1486.

Z. R. Wang, et al., "Low power flexible organic thin film transistors with amorphous $Ba_{0.7}Sr_{0.3}TiO_3$ gate dielectric grown by pulsed laser deposition at low temperature", Organic Electronics, vol. 13, 2012, pp. 1223-1228.

Y. G. Seol, et al., "Mechanically flexible low-leakage multilayer gate dielectrics for flexible organic thin film transistors", Applied Physics Letters, vol. 93, 2008, pp. 013305-1-013305-3.

* cited by examiner

SEMICONDUCTOR DEVICE STRUCTURE, METHOD FOR MANUFACTURING THE SAME AND PIXEL STRUCTURE USING THE SAME

This application claims the benefit of Taiwan application Serial No. 102105868, filed Feb. 20, 2013, the disclosure of which is incorporated by reference herein in its entirety.

TECHNICAL FIELD

The disclosure relates in general to a semiconductor device structure, a method for manufacturing the same and a pixel structure using the same, and relates to a flexible semiconductor device structure, a method for manufacturing the same and a pixel structure using the same.

BACKGROUND

To satisfy trends of light and compact electronic devices, flexible electronic devices with pliability and low prices become a development focus of many manufacturers. In most current flexible electronic devices, the pliability feature is usually achieved by reducing performance, such as significantly decreased characteristics of semiconductor devices in these flexible electronic devices.

SUMMARY

The disclosure relates to a semiconductor device structure, a method for manufacturing the semiconductor device structure and a pixel structure using the semiconductor device structure for satisfying performance and flexibility needs.

According to one embodiment, a semiconductor device structure is provided. The semiconductor device structure may comprise a substrate, a semiconductor layer, a first conductive layer, a second conductive layer, a first dielectric layer and a second dielectric layer. The first dielectric layer is disposed on the substrate. The second dielectric layer is disposed on the first dielectric layer. The semiconductor layer is disposed on the first dielectric layer or the second dielectric layer. The first dielectric layer is adjacent to the first dielectric layer or the second dielectric layer. The second dielectric layer is disposed on the second dielectric layer or the first dielectric layer. The Young's modulus of the second dielectric layer is smaller than the Young's modulus of the first dielectric layer.

According to another embodiment, a method for manufacturing a semiconductor device structure is provided. The method may comprise providing a substrate, forming a first dielectric layer on the substrate, forming a second dielectric layer on the first dielectric layer, forming a semiconductor layer on the first dielectric layer or the second dielectric layer, forming a first conductive layer adjacent to the first dielectric layer or the second dielectric layer, and forming a second conductive layer on the second dielectric layer or the first dielectric layer. The Young's modulus of the second dielectric layer is smaller than the Young's modulus of the first dielectric layer.

According to an alternative embodiment, a semiconductor device structure is provided. The semiconductor device structure may comprise a substrate, a first dielectric layer, a second dielectric layer, a first semiconductor layer, a second semiconductor layer, a first conductive layer and a second conductive layer. The first dielectric layer is disposed on the substrate, and comprises a first patterned dielectric film and a second patterned dielectric film. The second dielectric layer is disposed on the first dielectric layer. The Young's modulus of the second dielectric layer is smaller than the Young's modulus of the first dielectric layer. The first semiconductor layer is disposed on the substrate. The first conductive layer is disposed on the first patterned dielectric film. The second semiconductor is disposed on the second patterned dielectric film. The first semiconductor layer and the first conductive layer are disposed at two opposite sides of the first patterned dielectric film, and the first conductive layer and the second semiconductor layer are disposed at two opposite sides of the second patterned dielectric film. The second conductive layer is disposed on the second dielectric layer, and is electrically connected to the first semiconductor layer, the second semiconductor layer or the first conductive layer via a contact hole.

According to another embodiment, a pixel structure is provided. The pixel structure may comprise at least two pixel electrodes and a driving transistor. The pixel electrodes are connected to an end electrode of the driving transistor. The driving transistor comprises a substrate, a first dielectric layer, a second dielectric layer, a semiconductor layer, a first conductive layer and a second conductive layer. The first dielectric layer is disposed on the substrate, and comprises a first patterned dielectric film and a second patterned dielectric film. The second dielectric layer is disposed on the first dielectric layer. The Young's modulus of the second dielectric layer is smaller than the Young's modulus of the first patterned dielectric film or the second patterned dielectric film. The semiconductor layer is adjacent to the first dielectric layer or the second dielectric layer. The first conductive layer is adjacent to the first dielectric layer or the second dielectric layer. The semiconductor layer and the first conductive layer are disposed at two opposite sides of the first patterned dielectric film. The second conductive layer is disposed on the second dielectric layer, and is electrically connected to the semiconductor layer or the first conductive layer via a contact hole. The driving transistor drives the pixel electrodes to generate a pixel.

According to another embodiment, a pixel structure is provided. The pixel structure may comprise at least two pixel electrodes and a driving transistor. The pixel electrodes are connected to an end electrode of the driving transistor. The driving transistor comprises a substrate, a dielectric layer, a first conductive layer and a second conductive layer. The dielectric layer is disposed on the substrate. The first conductive layer and the semiconductor layer are disposed at two opposite sides of the dielectric layer. The second conductive layer is disposed on the dielectric layer, and is electrically connected to the semiconductor layer or the first conductive layer via a contact hole. The driving transistor drives the pixel electrodes to generate a pixel.

Figure 1:
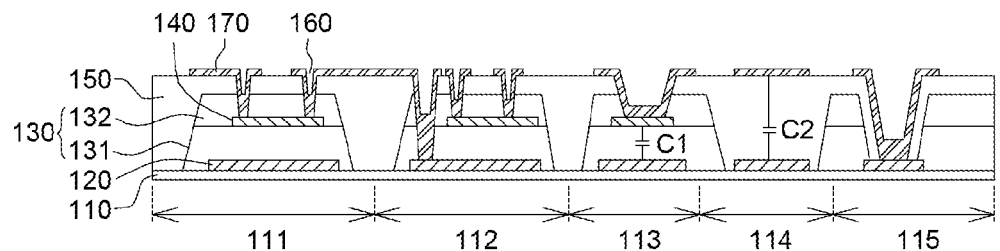
FIG. 1 is a sectional view of a semiconductor device structure 100 according to a first embodiment.

In the following detailed description, for purposes of explanation, numerous specific details are set forth in order to provide a thorough understanding of the disclosed embodiments. It will be apparent, however, that one or more embodiments may be practiced without these specific details. In other instances, well-known structures and devices are schematically shown in order to simplify the drawing.

DETAILED DESCRIPTION

Embodiments are described in details with reference to the accompanying drawings below. In the drawings, similar elements are given similar denotations. Further, in the embodiments, the semiconductor devices with channel protection layer and top-gate structure are taken as examples. It should be noted that the embodiments are also applicable to a back channel etch type device structure.

First Embodiment

FIG. 1 shows a sectional view of a semiconductor device structure 100 according to a first embodiment. The semiconductor device structure 100 comprises a substrate 110, a semiconductor layer 140, a first conductive layer 120, a second conductive layer 170, a first dielectric layer 130 and a second dielectric layer 150. In an embodiment, the substrate 110 may comprise a first area 111, a second area 112, a third area 113, a fourth area 114 and a fifth area 115 that are neighboring to one another. In an alternative embodiment, the substrate 110 may be a single area from any of the first area 111 to the fifth area 115, or a combination of any two to four areas of the first area 111 to the fifth area 115.

In an embodiment, the first area 111 to the fifth area 115 may be disposed with different types of semiconductor devices. For example, the first area 111 and the second area 112 are transistor areas for thin-film transistors (TFTs) or other suitable devices. The third area 113 and the fourth area 114 may be capacitor areas. Further, the fourth area 114 may be a cross-over region of the first conductive layer and the second conductive layer. The fifth area 115 may be a contact hole region.

Referring to FIG. 1, in the first area 111 and the second area 112 of the substrate 110, the first conductive layer 120 is disposed on the substrate 110. For example, the substrate 110 may be made of glass, a polymer such as polyimide, polyethersulfone (PES) or polyetherether ketone (PEEK), a metal foil, or other material having similar properties. The first dielectric layer 130 comprises a first patterned dielectric film 131 and a second patterned dielectric film 132, which may be made of the same material or different materials. The first patterned dielectric film 131 covers the first conductive layer 120, and the semiconductor layer 140 is disposed on the first patterned dielectric film 131. In other words, the first conductive layer 120 and the semiconductor layer 140 are located at two sides of the first patterned dielectric film 131, with the first patterned dielectric film 131 separating the first conductive layer 120 from the semiconductor layer 140. The second patterned dielectric film 132 is disposed on the semiconductor layer 140. The second dielectric layer 150 is disposed on the first dielectric layer 130 to cover the first patterned dielectric film 131 and the second patterned dielectric film 132.

In an embodiment, an opening 160 exposes a part of the first conductive layer 120 or the semiconductor layer 140. The second conductive layer 170 is disposed in the opening 160 to be electrically connected to the first conductive layer 120 or the semiconductor layer 140. In an alternative embodiment, the second conductive layer 170 may be disposed on a part of the second dielectric layer 150, and be electrically connected to the first conductive layer 120 or the semiconductor layer 140 in two openings.

In an embodiment, the first dielectric layer 130 and the second dielectric layer 150 may be a single-layer or multi-layer structure, formed by one or more than one layer of patterned dielectric film.

In an embodiment, the first conductive layer 120, the semiconductor layer 140 and the first dielectric layer 130 in the first area 111 and the second area 112 form a bottom-gate transistor. That is to say, the first conductive layer 120 is a gate layer or a gate electrode, and the semiconductor layer 140 is an active layer, with the gate layer disposed under the active layer. The active layer may be made of a semiconductor material, e.g., a Si-based material, an organic semiconductor such as pentacene, poly(3-hexylthiophene) (P3HT), dinaphthothienothiophene (DNTT), or a metal oxide semiconductor having one or more of ZnO, InO$_x$, GaOx, In$_x$Ga$_y$Zn$_z$O, In$_x$S$_y$Zn$_z$O and Al$_x$Sn$_y$Zn$_z$O. The second conductive layer 170 is electrically connected to the first conductive layer 120 or the active layer (the semiconductor layer 140) via the opening 160 to form a source contact and a drain contact.

Referring to FIG. 1, the third area 113 of the substrate 110 has a structure similar to the semiconductor device structures in the first area 111 and the second area 112. A difference of the structure in third area 113 from those in the first area 111 and the second area 112 is that, a capacitor C1 is formed by the first conductive layer 120, the semiconductor layer 140 and the first patterned dielectric film 131 in the third area 113.

Referring to FIG. 1, in the fourth area 114 of the substrate 110, the second dielectric layer 150 covers the first conductive layer 120. The first conductive layer 120, the second dielectric layer 150 and the second conductive layer 170 may also form a capacitor C2.

In an embodiment, the first dielectric layer 130 does not cover the first conductive layer 120. In an alternative embodiment, the first dielectric layer 130 may partially cover the first conductive layer 120. Further, in addition to a capacitor, the circuit design of the structure of the fourth area 114 may also be a cross-over region of the first conductive layer 120 and the second conductive layer 170.

Referring to FIG. 1, in the fifth area 115 of the substrate 110, the opening 160 of the second dielectric layer 150 directly exposes the first conductive layer 120. The second conductive layer 170 is disposed in the opening 160 and is electrically connected to the first conductive layer 120. The first conductive layer 120, the second conductive layer 170 and the second dielectric layer 150 form a contact hole.

In an embodiment, given that the effective Young's modulus of the second dielectric layer 150 is smaller than the Young's modulus of the first patterned dielectric film 131 or the second patterned dielectric film 132 of the first dielectric layer 130, the conductive layer or the dielectric layer may be a single-layer or multi-layer structure, and is not limited to a specific material. For example, the second dielectric layer 150 may be made of an organic material system such as polyimide, polyvinyl pyrrolidone (PVP) or polymethyl methacrylate (PMMA), and/or an inorganic material system such as an oxide or a nitride.

In an alternative embodiment, the effective Young's modulus of the second dielectric layer 150 is between 0.1 MPa and 80 GPa. The first patterned dielectric film 131 may be an inorganic material system of an oxide or a nitride selected from $SiO_x$, $SiN_x$, SiON, $AlO_x$, $HfO_x$, $HfSiO_x$, AlN and SiOC, have a Young's modulus between 1 GPa and 450 GPa, and have a leakage current density smaller than $10^{-1}$ $A/cm^2$ when the electric field strength is 1 MV/cm. By designing the effective Young's modulus of the second dielectric layer 150 to be smaller than the Young's modulus of the first patterned dielectric film 131, in the event of a flexure, the second dielectric layer 150, as a non-main working area of the semiconductor device, absorbs most of the stress from the flexure. Consequently, the first dielectric layer 120, the semiconductor layer 140 and the first dielectric layer 130, jointly regarded as a main working area of the semiconductor device, bears a smaller deformation, so that the overall flexibility of the semiconductor device is enhanced. Meanwhile, in contribution to the smaller leakage current density of the first patterned dielectric film 131 of the main working area, the semiconductor device structure 100 is able to maintain device characteristics. For example, the capacitor in the third area 113 is able to preserve more stable electrical characteristics such as a high pressure resistivity and a low leakage current that can be applied in circuit designs.

In an embodiment, in addition to serving as a cross-over region of the first conductive layer 120 and the second conductive layer 170 in the circuit layout, the structure in the fourth area 114 is capable of reducing parasitic capacitance in the circuit. Further, when serving as a capacitor, the thickness of the structure may be changed during flexing due to the lower Young's modulus of the second dielectric layer 150, so that a bending level of a flexible display device, a flexible electronic device or a flexible circuit may be detected through such property.

In an embodiment, the first area 111 to the fifth area 115 are separated by the second electric layer 150. In another embodiment, two or more of the first area 111 to the fifth area 115 are separated by the second dielectric layer 150, as shown by a structure that is not separated by the second dielectric layer 150 in FIG. 5. That is to say, the electronic device with a dielectric layer separated from another dielectric layer, wherein the Young's modulus of the two layers are not equal and electronic elements are mainly disposed in an area having a greater Young's modulus, are encompassed within the scope of the disclosure.

FIGS. 2A to 2E show a manufacturing processes of the semiconductor device structure 100 in FIG. 1. For example, the manufacturing method below may perform by a physical vapor deposition (PVD), chemical vapor deposition (CVD), spin-coating, coating or sol-gel process.

Figure 2A:
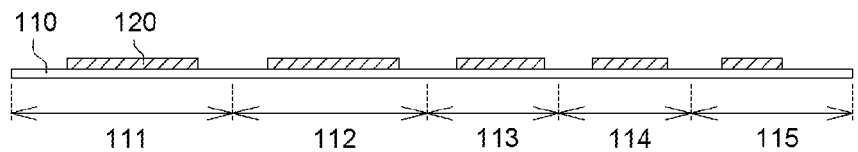
FIGS. 2A to 2E are a manufacturing processes of the semiconductor device structure in FIG. 1.

Referring to FIG. 2A, a substrate 110 is provided. In an embodiment, the substrate 110 is divided into a first area 111, a second area 112, a third area 113, a fourth area 114 and a fifth area 115 that are neighboring to one another. In another embodiment, the substrate 110 may be a single area or a combination of any two to four areas of the first area 111 to the fifth area 115. A photolithography or etching process is performed by use of a first mask (not shown) to form a patterned first conductive layer 120 on the substrate 110.

Figure 2B:
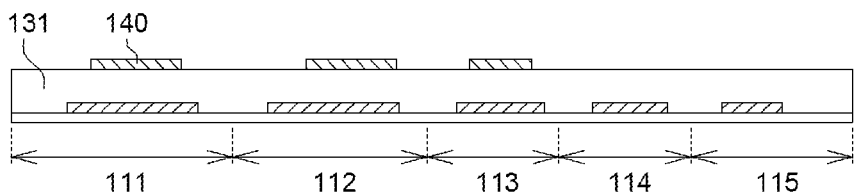

Referring to FIG. 2B, a first patterned dielectric film 131 is formed to cover the substrate 110 and the first conductive layer 120, and a photolithography or etching process is performed by use of a second mask (not shown) to form a semiconductor layer 140 on the first patterned dielectric film 131. In an embodiment, the semiconductor layer 140 is formed on the first area 111, the second area 112 and the third area 113 and not formed on the fourth area 114 and the fifth area 115 of the substrate 110. The semiconductor layer 140 in the first area 111 and the second area 112 is served as the active layer of a thin-film transistor (TFT), and in the third area 113 is served as an etch protection layer of the first patterned dielectric film 131, so as to ensure that the capacitor structure characteristics of the third area 113 do not alter in subsequent processes.

Figure 2C:
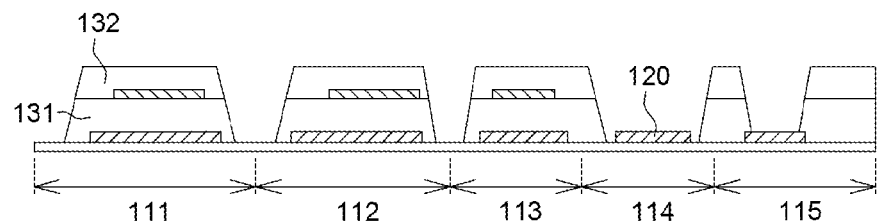

Referring to FIG. 2C, a second patterned dielectric film 132 is formed to cover the first patterned dielectric film 131 and the semiconductor layer 140, and the first patterned dielectric film 131 and the second patterned dielectric film 132 are patterned by use of a third mask (not shown). In an embodiment, the first patterned dielectric film 131 and second patterned dielectric film 132 do not cover the first conductive layer 120 on the fourth area 114. In an alternative embodiment, the first patterned dielectric film 131 may partially cover the first conductive layer 120 on the fourth area 114.

Figure 2D:
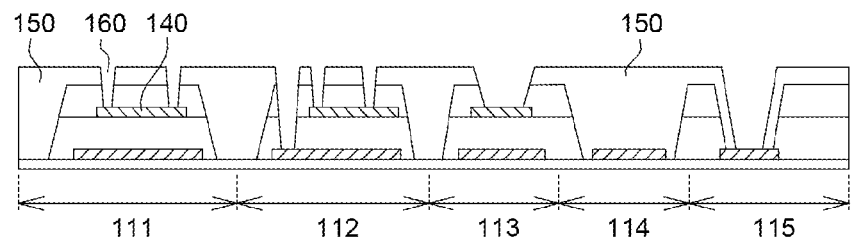

Referring to FIG. 2D, a second dielectric layer 150 is formed to cover the substrate 110, the first conductive layer 120, the first patterned dielectric film 131 and the second patterned dielectric film 132, and an opening 160 is formed by use of a fourth mask (not shown). The opening 160 exposes a part of the first conductive layer 120 or the semiconductor layer 140.

Figure 2E:
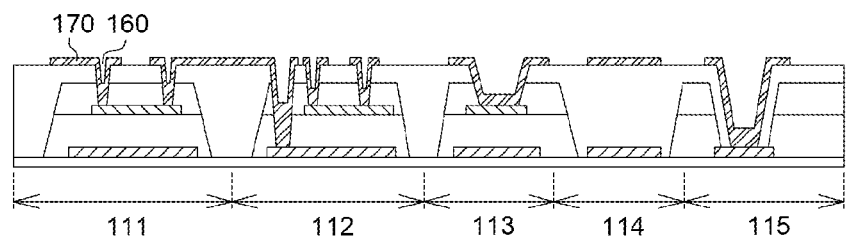

Referring to FIG. 2E, a patterned second conductive layer 170 is formed at the opening 160 by use of a fifth mask (not shown) to complete the semiconductor device structure 100 shown in FIG. 1.

In an embodiment, the steps in the above manufacturing processes of the semiconductor device structure may be appropriately adjusted according to actual needs. For example, the opening may first be formed when patterning the first patterned dielectric film and the second patterned dielectric film. That is to say, in the step of patterning the first patterned dielectric film 131 and the second patterned dielectric film 132 by use of the third mask, the opening 160 may also be formed. Thus, the method for manufacturing a semiconductor device structure of the embodiments is flexible.

FIGS. 3A to 3E show another manufacturing processes of the semiconductor device structure 100 in FIG. 1 according to an embodiment. A difference of the process in FIGS. 3A to 3E from that of the process in FIGS. 2A to 2E is a time point of forming the opening 160. Other similar details shall be omitted herein.

Figure 3A:
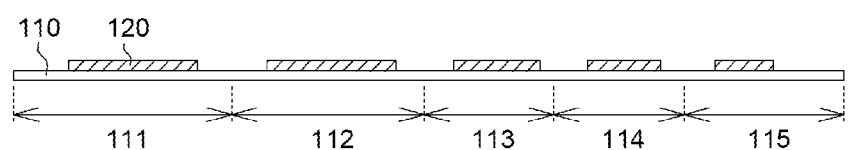
FIGS. 3A to 3E are another manufacturing processes of the semiconductor device structure in FIG. 1.

Referring to FIG. 3A, a substrate 110 is provided. A patterned first conductive layer 120 is formed on the substrate 110 by use of a first mask (not shown).

Figure 3B:
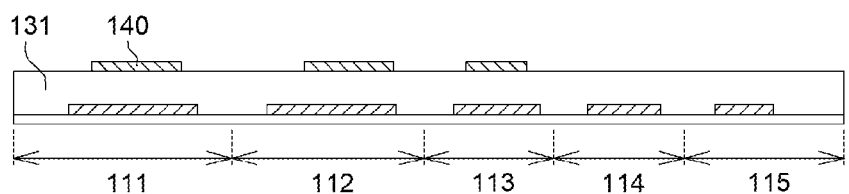

Referring to FIG. 3B, a first patterned dielectric film 131 is formed on the substrate 110 and the first conductive layer 120, and a semiconductor layer 140 is formed on the first patterned dielectric film 131 by use of a second mask (not shown).

Figure 3C:
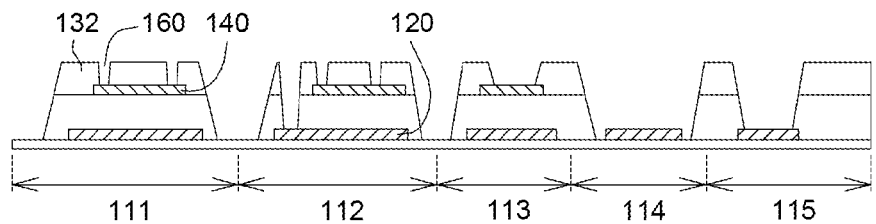

Referring to FIG. 3C, a second patterned dielectric film 132 is formed to cover the first patterned dielectric film 131 and the semiconductor layer 140, and the first patterned dielectric film 131 and the second patterned dielectric film 132 are patterned by use of a third mask (not shown), and an opening 160 is also formed to expose all or a part of the first conductive layer 120 or the semiconductor layer 140.

Figure 3D:
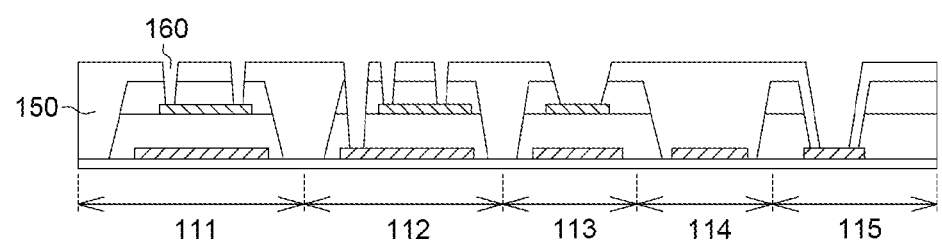

Referring to FIG. 3D, a second dielectric layer 150 is formed to cover the substrate 110, the first conductive layer 120, the semiconductor layer 140, the first patterned dielectric film 131, the second patterned dielectric film 132 and the opening 160, and the opening 160 is again formed on the second dielectric layer 150 by use of a fourth mask (not shown).

Figure 3E:
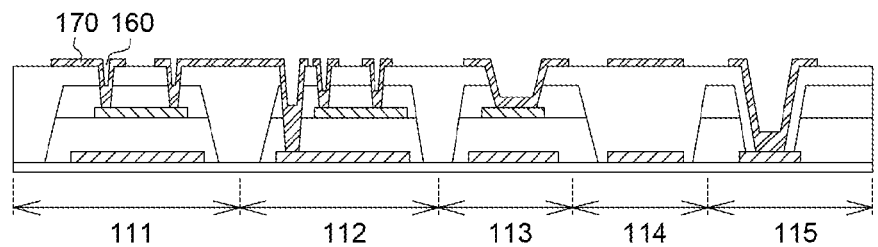

Referring to FIG. 3E, a second conductive layer 170 is formed at the opening 160 by use of a fifth mask (not shown) to complete the semiconductor device structure in FIG. 1.

Second Embodiment

Figure 4A:
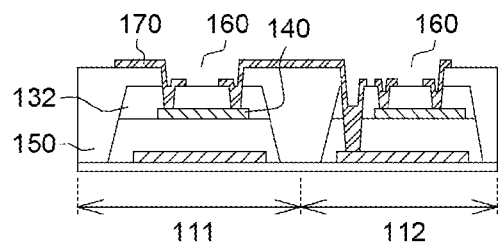
FIGS. 4A to 4C are sectional views of a semiconductor device structure according to a second embodiment.

FIG. 4A shows a sectional view of a semiconductor device structure 200 according to a second embodiment. The second embodiment is based on a variation of the transistor structure of the first embodiment, and has a similar manufacturing process as that of the first embodiment—the similarities shall be omitted herein. Referring to FIG. 4A, a difference of the second embodiment from the first embodiment is that, in the first area 111 and the second area 112 of the semiconductor device structure 200, the second dielectric layer 150 does not entirely cover the second patterned dielectric film 132. That is to say, the opening 160 has a greater range, and meanwhile exposes a part of the semiconductor layer 140 and the second patterned dielectric film 132, so that other contacts may be designed when depositing the second conductive layer 170.

Figure 4B:
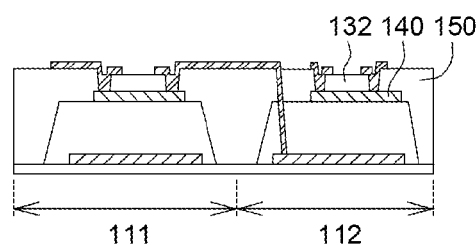
Figure 4C:
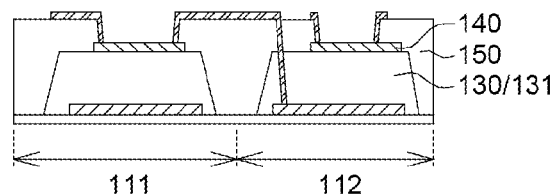

FIGS. 4B and 4C are other variations of the semiconductor device structure in FIG. 4A. Referring to FIG. 4B, the second patterned dielectric film 132 has a different size, and covers a part of the semiconductor layer 140. In the semiconductor device structure in FIG. 4C, the first dielectric layer 130 is formed by a first patterned dielectric film 131. The first patterned dielectric film 131 is single-layer. It should be noted that, the above variations are not to be construed as limitations of the embodiments, and other modifications to shapes and sizes of the first dielectric layer 130, the first patterned dielectric film 131 or the second patterned dielectric film 132 are encompassed within the scope of the disclosure.

Third Embodiment

Figure 5:
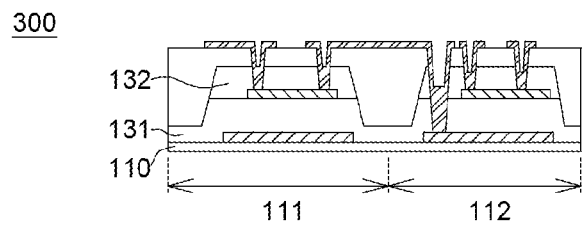
FIG. 5 is a sectional view of a semiconductor device structure according to a third embodiment.

FIG. 5 shows a sectional view of a semiconductor device structure 300 according to a third embodiment. The manufacturing process of the third embodiment is similar to that of the first embodiment, and shall be omitted herein. A structural difference of the third embodiment is that, in the first area 111 and the second area 112 of the semiconductor device structure 300, the first patterned dielectric film 131 or the second patterned dielectric film 132 is partially breaking off or connected. That is to say, in the patterning steps shown in FIGS. 2B and 2C, the first patterned dielectric film 131 or the second patterned dielectric film 132 may be partially breaking off according to manufacturing process needs or product designs. Further, the remaining first patterned dielectric film 131 between the first area 111 and the second area 112 may serve as a protection layer of the substrate 110 to prevent the substrate 110 from damages in the patterning steps.

Fourth Embodiment

Figure 6:
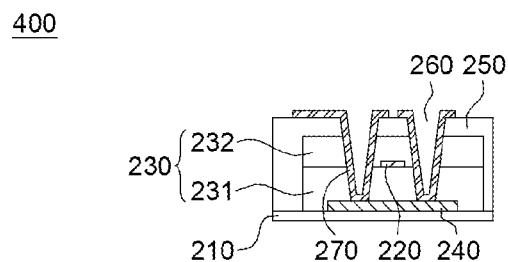
FIG. 6 is a sectional view of a semiconductor device structure according to a fourth embodiment.

FIG. 6 shows a sectional view of a semiconductor device structure 400 according to a fourth embodiment. A structural difference of the fourth embodiment from the semiconductor device structure 100 of the first embodiment is that, the semiconductor device structure 400 is a top-gate transistor.

Referring to FIG. 6, in the semiconductor device structure 400 according to one embodiment, a semiconductor layer 240 is disposed on a substrate 210. A first dielectric layer 230 comprises a first patterned dielectric film 231 and a second patterned dielectric film 232, which may be made of a same material or different materials. The first patterned dielectric film 231 is disposed on the semiconductor layer 240, and the first conductive layer 220 is disposed on the first patterned dielectric film 231. That is to say, the first patterned dielectric film 231 separates the first conductive layer 220 from the semiconductor layer 240, with the first conductive layer 220 and the semiconductor layer 240 being disposed at two side of the first patterned dielectric film 231. The second patterned dielectric film 232 is disposed on the first conductive layer 220. The second dielectric layer 250 covers the first patterned dielectric film 231 and the second patterned dielectric film 232. The first conductive layer 220, the semiconductor layer 240 and the first patterned dielectric film 231 form a top-gate transistor. In other words, the semiconductor layer 240 is an active layer, and the first conductive layer 220 is a gate layer disposed on the active layer. Two separate openings 160 expose a part of the semiconductor layer 240. Two second conductive layers 270 are disposed in the openings 260 and are electrically connected to the semiconductor layer 240 to form a source contact and a drain contact.

The first dielectric layer 230 may be a single-layer or multi-layer structure, and is formed by at least one layer of patterned dielectric film.

Fifth Embodiment

Figure 7:
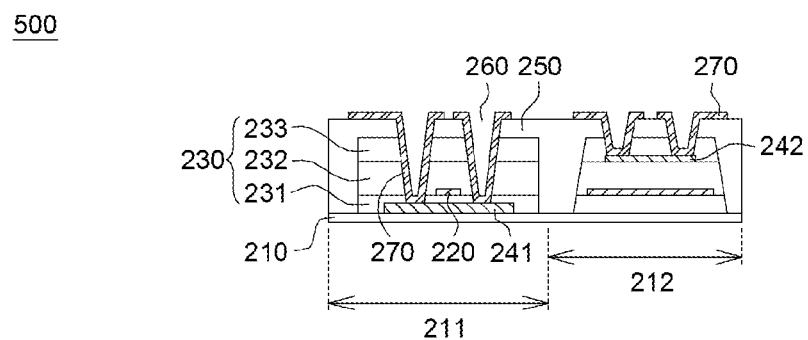
FIG. 7 is a sectional view of a semiconductor device structure according to a fifth embodiment.

FIG. 7 shows a sectional view of a semiconductor device structure 500 according to a fifth embodiment. The semiconductor device structure 500 comprises a substrate 210, a first semiconductor layer 241, a second semiconductor layer 242, a first conductive layer 220, a second conductive layer 270, a first dielectric layer 230 and a second dielectric layer 250. The substrate 210 comprises a first area 211 and a second area 212 that are neighboring to each other. A difference of the semiconductor device structure 500 from the semiconductor device structure 100 of the first embodiment is that, the semiconductor device structure 500 simultaneously comprises a top-gate transistor (the first area 211) and a bottom-gate transistor (the second area 212).

Referring to FIG. 7, in the first area 211 on the substrate 210, the first semiconductor layer 241 is disposed on the substrate 210. The first dielectric layer 230 comprises a first patterned dielectric film 231, a second patterned dielectric layer 232 and a third patterned dielectric film 233, which may be made of a same material or different materials. The first patterned dielectric film 231 is disposed on the first semiconductor layer 241, and the first conductive layer 220 is disposed on the first patterned dielectric film 231. That is to say, the first patterned dielectric film 231 separates the first conductive layer 220 from the first semiconductor layer 241, with the first semiconductor layer 241 and the first conductive layer 220 disposed at two opposite sides of the first patterned dielectric film 231. The second patterned dielectric film 232 is disposed on the first conductive layer 220. The third patterned dielectric film 233 is disposed on the second patterned dielectric film 232. The second dielectric layer 250 covers the first patterned dielectric film 231, the second patterned dielectric film 232 and the third patterned dielectric film 233. The first conductive layer 220, the first semiconductor layer 241 and the first patterned dielectric film 231 form a top-gate transistor. In other words, the first semiconductor layer 241 is an active layer, and the first conductive layer 220 is a gate layer disposed on the active layer. Two separate openings 160 expose a part of the first semiconductor layer 241. Two second conductive layers 270 are disposed in the openings 260 and are electrically connected to the first semiconductor layer 241 to form a source contact and a drain contact.

Referring to FIG. 7, in the second area 212 on the substrate 210, a second semiconductor layer 242 is disposed on the first conductive layer 220, i.e., on the second patterned dielectric film 232. The second semiconductor layer 242 and the first semiconductor layer 241 may be made of a same material or different materials. The second patterned dielectric film 232 separates the first conductive layer 220 from the second semiconductor layer 242, such that the first conductive layer 220 and the second semiconductor layer 242 are disposed at two opposite sides of the second patterned dielectric layer 232. The first conductive layer 220, the second semiconductor layer 242 and the second patterned dielectric film 232 form a bottom-gate transistor. Thus, the first conductive layer 220 serving as a gate layer is disposed under the second semiconductor layer 242 serving as an active layer. Two separate openings 260 expose a part of the second semiconductor layer 242. Two second conductive layers 270 are disposed in the openings 260 and are electrically connected to the second semiconductor layer 242 to form a source contact and a drain contact.

FIGS. 8A to 8F show a manufacturing processes of the semiconductor device structure 500 in FIG. 7. For example, the manufacturing method below may perform by a PVD, CVD, spin-coating, coating or sol-gel process.

Figure 8A:
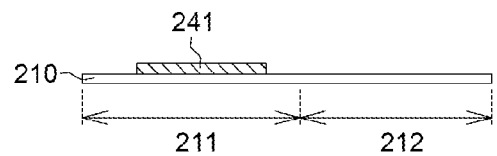
FIGS. 8A to 8F are a manufacturing processes of the semiconductor device structure in FIG. 7.

Referring to FIG. 8A, a substrate 210 is provided. The substrate 210 is divided into a first area 211 and a second are 212 that are neighboring to each other. A patterned first semiconductor layer 241 is formed on the substrate 210 by use of a first mask (not shown). In an embodiment, the first semiconductor layer 241 is formed at the first area 211 and is not formed on the second area 212 of the substrate 210.

Figure 8B:
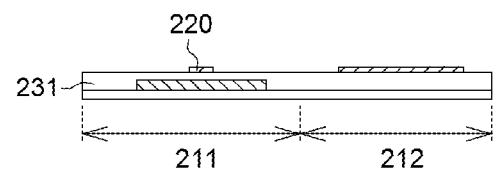

Referring to FIG. 8B, a first patterned dielectric layer 231 is formed to cover the substrate 210 and the first semiconductor 241, and a patterned first conductive layer 220 is formed on the first patterned dielectric film 231 by use of a second mask (not shown).

Figure 8C:
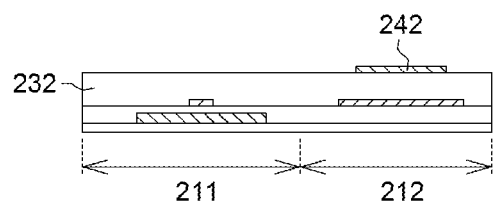

Referring to FIG. 8C, a second patterned dielectric film 232 is formed to cover the first patterned dielectric film 231 and the first conductive layer 220, and a patterned second semiconductor layer 242 is formed on the second patterned dielectric film 232 by use of a third mask (not shown). The second semiconductor layer 242 formed by this step is disposed at the second area 212 of the substrate 210.

Figure 8D:
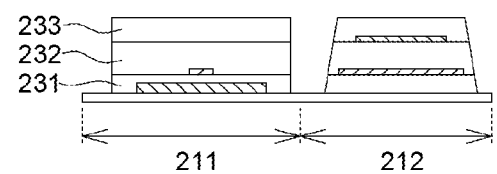

Referring to FIG. 8D, a third patterned dielectric film 233 is formed to cover the second semiconductor layer 242 and the second patterned dielectric film 232, and the first patterned dielectric film 231, the second patterned dielectric film 232 and the third patterned dielectric film 233 are patterned by use of a fourth mask (not shown).

Figure 8E:
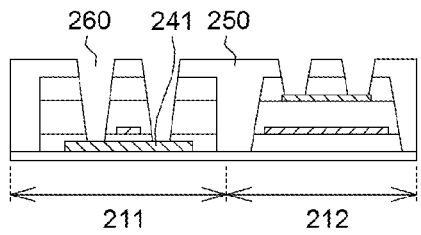

Referring to FIG. 8E, a second dielectric layer 250 is formed to cover the substrate 210, the first patterned dielectric film 231, the second patterned dielectric film 232 and the third patterned dielectric film 233, and an opening 260 is formed by use of a fifth mask (not shown). The opening 260 exposes a part of the first semiconductor layer 241 and a part of the second semiconductor layer 242.

Figure 8F:
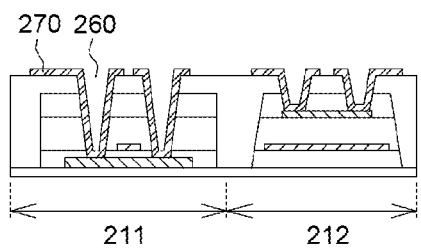

Referring to FIG. 8F, a second conductive layer 270 is formed at the opening 260 by use of a sixth mask (not shown) to complete the semiconductor device structure 500 in FIG. 7.

Sixth Embodiment

Figure 9A:
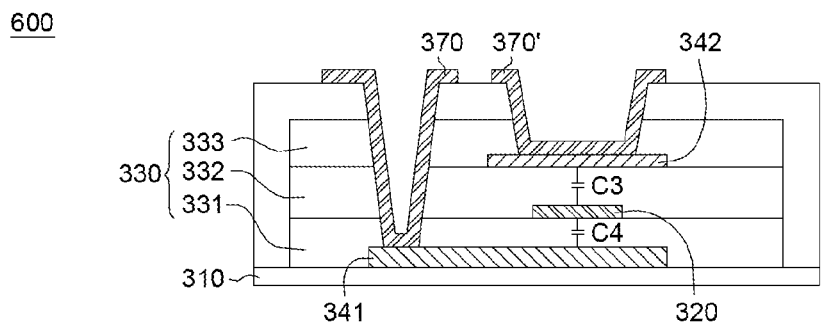
FIG. 9A to 9B are sectional views of a semiconductor device structure according to a sixth embodiment.
Figure 9B:
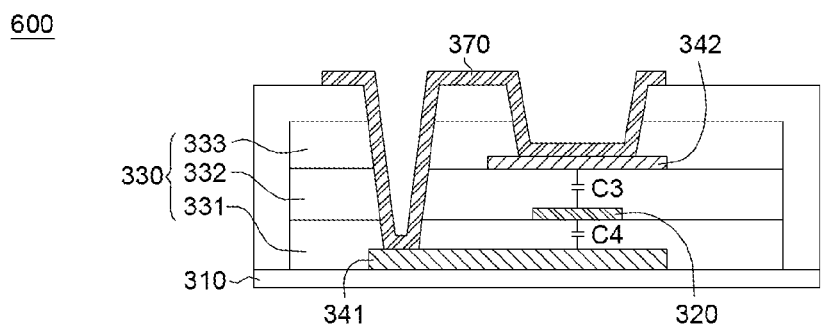

FIGS. 9A and 9B are sectional views of a semiconductor device structure 600 according to a sixth embodiment. Similarities of the sixth embodiment to the fifth embodiment shall be omitted herein. A first conductive layer 320, a second conductive layer 370, a first semiconductor layer 341, a second semiconductor layer 342 and a first dielectric layer 330 of the semiconductor device structure 600 form a capacitor structure. The first conductive layer 320 is separated from the first semiconductor layer 341 via a first patterned dielectric film 331, and is separated from the second semiconductor layer 342 via a second patterned dielectric film 332, and so two additional capacitors C3 and C4 can be formed in the semiconductor device structure 600.

A second conductive layer 370 is electrically connected to the first semiconductor layer 341 and the second conductive layer 342. Referring to FIG. 9A, two separate second conductive layers 370 and 370' are electrically connected to the first semiconductor layer 341 and the second semiconductor layer 342, respectively. Thus, the capacitors C3 and C4 in FIG. 9A are two independent capacitors that are separately operable for reducing a space of circuits or pixels.

Referring to FIG. 9B, the second conductive layer 370 is electrically connected to both the first semiconductor layer 341 and the second semiconductor layer 342, such that first semiconductor layer 341 and the second semiconductor layer 342 have the same potential. Thus, the capacitors C3 and C4 in FIG. 9B form a greater capacitor capable of increasing the amount of capacitance in a limited space, thereby enhancing flexibilities in the design of circuits or pixels.

Seventh Embodiment

Figure 10A:
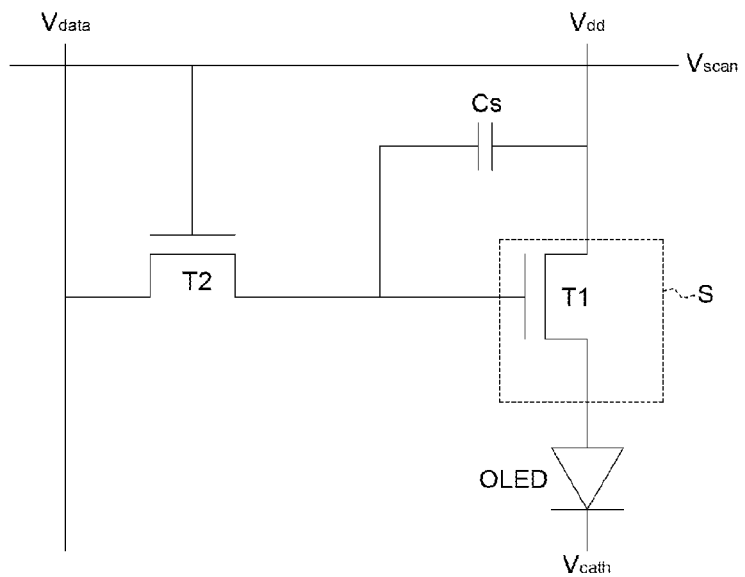
FIG. 10A is a circuit diagram of an active-matrix organic light-emitting diode (AMOLED) pixel structure according to a seventh embodiment.
Figure 10B:
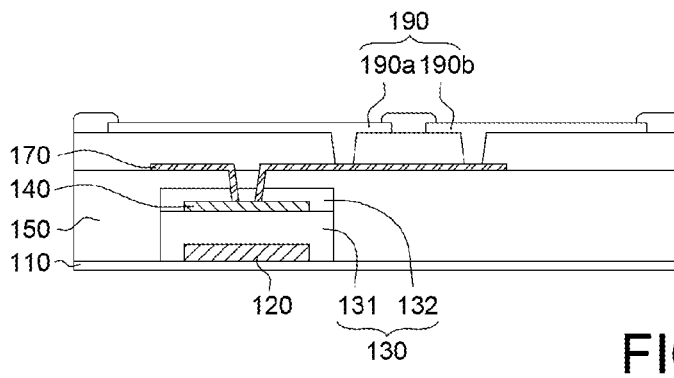
FIGS. 10B and 10C are sectional views of a contact area of a driving TFT and an OLED structure in FIG. 10A.

An application of a semiconductor device structure of the disclosure is given in a seventh embodiment. FIG. 10A shows a circuit diagram of an active-matrix organic light-emitting diode (AMOLED) pixel structure of the seventh embodiment. FIG. 10B shows a sectional view of an organic light-emitting diode (OLED) contact area S and a driving transistor T1. FIG. 10O shows another variation of dividing a pixel structure in FIG. 10B.

Figure 10C:
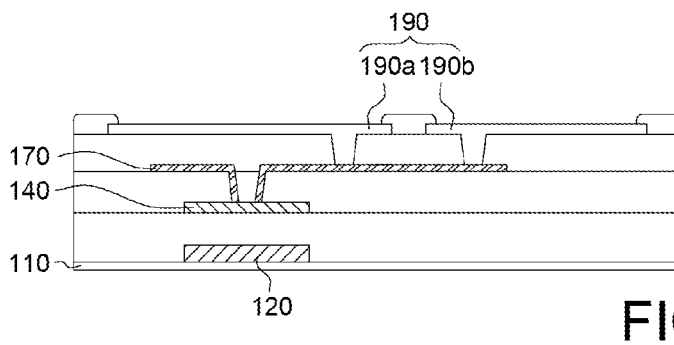

Referring to FIG. 10B, a semiconductor device formed by a semiconductor layer 140, a first dielectric layer 130, a second dielectric layer 150, a first conductive layer 120 and a second conductive layer 170 is disposed on a substrate 110. The semiconductor device serves as a driving transistor. As the Young's modulus of the second dielectric layer 150 is smaller than the Young's modulus of the first patterned dielectric film of the first dielectric layer 130, the pixel structure has a greater flexibility. Further, in FIG. 10B, an OLED sub-pixel electrode 190 is divided or patterned into two secondary pixel electrodes 190a and 190b, which are further connected to the driving transistor via the second conductive layer 170. The sub-pixel structure of the embodiment further enhances the flexibility of device. The above example divides the OLED pixel electrode into two parts, but the OLED pixel electrode may be divided into more than two parts based on needs or manufacturing limitations. Further, instead of applying the design of dividing the OLED pixel electrode to the semiconductor device structure of the disclosure, the divided secondary pixel electrodes 190a and 190b may be applied to a common transistor, as shown in FIG. 10C.

It will be apparent to those skilled in the art that various modifications and variations can be made to the disclosed embodiments. It is intended that the specification and examples be considered as exemplary only, with a true scope of the disclosure being indicated by the following claims and their equivalents.

What is claimed is:

1. A semiconductor device structure, comprising:
    a substrate;
    a first dielectric layer, disposed on the substrate, comprising a first patterned dielectric film and a second patterned dielectric film, wherein the second patterned dielectric film is disposed on the first patterned dielectric film, a Young's modulus of the first patterned dielectric film is between 1 GPa and 450 GPa, and a leakage current density of the first patterned dielectric film is smaller than $10^{-7}$ A/cm$^2$ when an electric field strength is 1 MV/cm;
    a second dielectric layer, disposed on the first dielectric layer, wherein a Young's modulus of the second dielectric layer is between 0.1 MPa and 80 GPa, and the Young's modulus of the second dielectric layer is smaller than the Young's modulus of the first patterned dielectric film;
    a semiconductor layer, disposed on the first dielectric layer or the second dielectric layer;

a first conductive layer, disposed adjacently to the first dielectric layer or the second dielectric layer; and a second conductive layer, disposed on the second dielectric layer, wherein the second conductive layer is electrically connected to at least one of the semiconductor layer and the first conductive layer via a contact hole penetrating the first dielectric layer or the second dielectric layer.

2. The semiconductor device structure according to claim 1, wherein the semiconductor layer and the first conductive layer are separated via the first patterned dielectric film.

3. The semiconductor device structure according to claim 2, wherein the first patterned dielectric film and the second patterned dielectric film are single-layer or multi-layer structures.

4. The semiconductor device structure according to claim 2, wherein the second dielectric layer is a single-layer or multi-layer structure.

5. The semiconductor device structure according to claim 2, wherein the first conductive layer is disposed under the semiconductor layer; the semiconductor layer, the first conductive layer, the second conductive layer and the first dielectric layer form a bottom-gate transistor; the semiconductor layer is an active layer of the bottom-gate transistor, and the first conductive layer is a gate electrode of the bottom-gate transistor.

6. The semiconductor device structure according to claim 2, wherein the first conductive layer is disposed on the semiconductor layer; the semiconductor layer, the first conductive layer, the second conductive layer and the first dielectric layer form a top-gate transistor; the semiconductor layer has functions of an active layer, and the first conductive layer has functions of a gate electrode.

7. The semiconductor device structure according to claim 2, wherein the semiconductor layer, the first conductive layer and the first dielectric layer form a capacitor.

8. The semiconductor device structure according to claim 7, wherein the capacitor is formed by the first conductive layer, the semiconductor layer and the first patterned dielectric film of the first dielectric layer.

9. The semiconductor device structure according to claim 1, wherein the first conductive layer and the second conductive layer are separated from each other via the second dielectric layer; the first conductive layer, the second conductive layer and the second dielectric layer form a capacitor.

10. The semiconductor device structure according to claim 1, wherein the first conductive layer is disposed on the substrate, the second dielectric layer or the first dielectric layer has an opening revealing the first conductive layer, and the first conductive layer is electrically connected to the second conductive layer.

11. A semiconductor device structure, comprising:
a substrate;
a first dielectric layer, disposed on the substrate, comprising a first patterned dielectric film and a second patterned dielectric film, wherein the second patterned dielectric film is disposed on the first patterned dielectric film, a Young's modulus of the first patterned dielectric film is between 1 GPa and 450 GPa, and a leakage current density of the first patterned dielectric MV/cm; film is smaller than $10^{-7}$ A/cm² when an electric field strength is 1
a second dielectric layer, disposed on the first dielectric layer, wherein a Young's modulus of the second dielectric layer is between 0.1 MPa and 80 GPa, and the Young's modulus of the second dielectric layer is smaller than the Young's modulus of the first patterned dielectric film;
a first semiconductor layer, disposed on the substrate;
a first conductive layer, disposed on the first patterned dielectric film;
a second semiconductor layer, disposed on the second patterned dielectric film, wherein the first semiconductor layer and the first conductive layer are disposed at two opposite sides of the first patterned dielectric film, and the first conductive layer and the second semiconductor layer are disposed at two opposite sides of the second patterned dielectric film; and
a second conductive layer, disposed on the second dielectric layer, being electrically connected to the first semiconductor layer, the second semiconductor layer or the first conductive layer via a contact hole penetrating the first dielectric layer or the second dielectric layer.

12. The semiconductor device structure according to claim 11, wherein the first semiconductor layer, the first conductive layer and the second conductive layer form a top-gate transistor; the first conductive layer, the second semiconductor layer and the second conductive layer form a bottom-gate transistor; the first conductive layer has functions of a gate layer, and the first semiconductor layer and the second semiconductor layer have functions of an active layer.

13. The semiconductor device structure according to claim 11, wherein the first semiconductor layer, the first conductive layer and the first patterned dielectric film form a capacitor; the first conductive layer, the second semiconductor layer and the second patterned dielectric film form another capacitor.

14. The semiconductor device structure according to claim 13, wherein the first semiconductor layer and the second semiconductor layer have the same potential.

15. The semiconductor device structure according to claim 11, wherein the first dielectric layer is a multi-layer structure.

16. The semiconductor device structure according to claim 11, wherein the second dielectric layer is a single-layer or multi-layer structure.

17. A pixel structure, comprising:
at least two pixel electrodes; and
a driving transistor, wherein the pixel electrodes are connected to an end electrode of the driving transistor; the driving transistor comprising:
a substrate;
a first dielectric layer, disposed on the substrate, comprising a first patterned dielectric film and a second patterned dielectric film, wherein the second patterned dielectric film is disposed on the first patterned dielectric film, a Young's modulus of the first patterned dielectric film is between 1 GPa and 450 GPa, and a leakage current density of the first patterned dielectric film is smaller than $10^{-7}$ A/cm² when an electric field strength is 1 MV/cm;
a second dielectric layer, disposed on the first dielectric layer, wherein a Young's modulus of the second dielectric layer is between 0.1 MPa and 80 GPa, and the Young's modulus of the second dielectric layer is smaller than the Young's modulus of the first patterned dielectric film or the second patterned dielectric film;
a semiconductor layer, disposed adjacently to the first dielectric layer or the second dielectric layer;
a first conductive layer, disposed adjacently to the first dielectric layer or the second dielectric layer, wherein the semiconductor layer and the first conductive layer are disposed at two opposite sides of the first patterned dielectric film; and a second conductive layer, disposed on the second dielectric layer, electrically connected to the semiconductor layer or the first conductive layer via a contact hole penetrating the first dielectric layer or the second dielectric layer;

wherein, the driving transistor drives the pixel electrodes to generate a pixel.

18. The pixel structure according to claim 17, wherein the second dielectric layer is a single-layer or multi-layer structure.

19. A pixel structure, comprising:
at least two pixel electrodes; and
a driving transistor, wherein the pixel electrodes are connected to an end electrode of the driving transistor; the driving transistor comprising:
a substrate;
a semiconductor layer, disposed on the substrate;
a dielectric layer, disposed on the semiconductor layer, comprising a first patterned dielectric film and a second patterned dielectric film wherein the second patterned dielectric film is disposed on the first patterned dielectric film, a Young's modulus of the first patterned dielectric film is between 1 GPa and 450 GPa, and a leakage current density of the first patterned dielectric film is smaller than $10^{-7}$ A/cm$^2$ when an electric field strength is 1 MV/cm;
a first conductive layer, wherein the first conductive layer and the semiconductor layer are disposed at two opposite sides of the dielectric layer; and
a second conductive layer, disposed on the dielectric layer, electrically connected to the semiconductor layer or the first conductive layer via a contact hole penetrating the first dielectric layer or the second dielectric layer;
wherein, the driving transistor drives the pixel electrodes to generate a pixel.

* * * * *